United States Patent [19]

Kasperkovitz

[11] Patent Number: 4,523,328
[45] Date of Patent: Jun. 11, 1985

[54] FM-RECEIVER INCLUDING A FREQUENCY-LOCKED LOOP

[75] Inventor: Wolfdietrich G. Kasperkovitz, Eindhoven, Netherlands

[73] Assignee: U.S. Philips Corporation, New York, N.Y.

[21] Appl. No.: 468,229

[22] Filed: Feb. 22, 1983

[30] Foreign Application Priority Data

Mar. 9, 1982 [NL] Netherlands ............... 8200959

[51] Int. Cl.$^3$ ............................................. H04H 5/00
[52] U.S. Cl. .................................................. 381/3; 381/4
[58] Field of Search ............................................. 381/3–14

[56] References Cited

U.S. PATENT DOCUMENTS 3,163,717 12/1964 Loughlin ................................. 381/3
3,466,399 9/1969 Dias ........................................ 381/7
3,798,376 3/1974 Limberg ................................. 381/4

Primary Examiner—Gene Z. Rubinson
Assistant Examiner—W. J. Brady
Attorney, Agent, or Firm—Thomas A. Briody; William J. Streeter

[57] ABSTRACT

FM-receiver including a frequency-locked loop (2–14), which loop includes, successively connected, a voltage controlled oscillator (8), a mixer circuit (2) connected to an aerial input, an IF-portion comprising an IF-filter (9), an FM-detector (4), a loop filter (5) and a loop amplifier (6) for adjusting the transfer characteristic of the frequency locked loop (2–14), which loop amplifier (6) is connected to a control input of the voltage-controlled oscillator (8) for a feedback of the modulation signal of the received FM-signal. The loop filter (5) comprises a first low-pass filter (14). The FM-receiver being realizable in integrated circuit form and suitable for processing FM-stereo signals. The receiver is at least comparable to conventional FM-stereo receivers as regards selectivity, harmonic distortion and stability, the conventional FM-stereo receivers not being realizable in integrated circuit form. The stereo sum and the stereo difference signal are selectively and separately fedback by two simple, comparatively less selective parallel-arranged filter circuits (14; 18).

8 Claims, 11 Drawing Figures a b

FM-RECEIVER INCLUDING A FREQUENCY-LOCKED LOOP

BACKGROUND OF THE DISCLOSURE

The invention relates to an FM-receiver comprising a frequency-locked loop which includes, in succession, a voltage-controlled oscillator, a mixer circuit connected to an aerial input, an IF-portion comprising an IF-filter, an FM-detector, a loop filter and a loop amplifier for adjusting the transfer characteristic of the frequency-locked loop. The loop amplifier is connected to a control input of the voltage-controlled oscillator for feedback of the modulation signal of the received FM-signal, the filter comprising a first low-pass filter.

Such an FM-receiver is known from the Netherlands Patent Application No. 7906602 which has been laid open to public inspection.

In the known FM-receiver, when being correctly tuned to a wanted transmitter signal, the FM-aerial signal having an average frequency $\overline{RF}$ is amplified and mixed down in the mixer circuit to a low, average intermediate frequency $\overline{IF}$ by means of the oscillator signal which has an average frequency $\overline{OF}$. Simultaneously, by the feedback of the modulation in the frequency-locked loop, the frequency deviation of the received FM-aerial signal is compressed, for example by a factor of 5 from 75 KHz to 15 KHz. This reduces considerably the foldover distortion of the FM-signal in the IF-portion, which is the result of the comparatively low average intermediate frequency $\overline{IF}$.

The low intermediate frequency $\overline{IF}$ in combination with the compression of the frequency deviation makes it possible to realize the known FM-receiver in integrated circuit form. However, for an adequate signal processing a number of requirements must be satisfied. For a selectivity which is effective in the most critical circumstances, and an adequately wide FM-IF-passband the IF-filter must be of a higher order, for example of the $4^{th}$ order. In addition, in practice the stability of the frequency-locked loop is guaranteed only when, within the passband of the closed loop—that is to say the frequency range in which the loop gain is equal to one—the phase shift of the modulation signal in the loop is less than 180°. This phase shift is predominantly effected in the IF-filter, the FM-detector and the first low-pass filter and limits significantly the number of choices as regards the order, the bandwidth and the class of the filters. A further restraint is the requirement that for an effective compression of the frequency deviation the bandwidth of the open loop, that is to say the bandwidth of the first low-pass filter must include at least a considerable portion of the modulation signal.

In practice these requirements can only be satisfied by a certain choice of filter parameters, when the bandwidth of the modulation signal is of the order of magnitude of that of an FM-mono signal.

With modulation signals having a bandwidth of the order of the stereo multiplex signal (53 KHz) the requirements as regards compression of the frequency swing deviation, selectivity and stability result in conflicting filter parameters. Thus, for an effective compression of the frequency deviation of FM-stereo signals, the bandwidth of the first low-pass filter shoulld amount to 40 to 45 KHz and the open loop gain within this bandwidth must be approximately 12 dB. This results in a passband of the closed loop of 160 to 180 KHz when the first low-pass filter has a first order roll-off of 6 dB/octave. Owing to the first low-pass filter the phase shift within the pass-band of the closed loop is at its maximum at the 160 to 180 KHz limit frequency of this passband. With the given order and loop gain this maximum phase shift amounts to approximately 90°. In order to satisfy the stability requirement the phase shift produced by the IF-filter and the FM-detector within this 160 to 180 KHz passband must be less than approximately 90°. For a $4^{th}$ or higher order IF-filter this is only realizable at very large bandwidths. Such very large bandwidths are impermissible for an effective IF-selectivity. Consequently, the prior art FM-receiver is not suitable for receiving and processing FM-stereo signals.

SUMMARY OF THE INVENTION

It is an object of the invention to provide an FM-receiver, which is realizable as an integrated circuit and suitable for processing both FM-mono and FM-stereo signals, and is at least comparable to conventional, non-integrable high grade receivers as regards selectivity, sensitivity and harmonic distortion.

An FM-receiver according to the invention, is characterized in that a first low-pass filter selects the audio-frequency stereo sum signal from a stereophonic FM-multiplex signal, and the loop filter also comprises a bandpass filter circuit arranged in parallel with the first low-pass filter for a selection of the stereo difference signal being amplitude-modulated on a suppressed stereo sub-carrier from a stereophonic FM-multiplex signal. The phase shift of the first low-pass filter and the phase shift of the bandpass filter circuit is, at least within the passband of the frequency-locked loop, not more than approximately 90°.

The invention is based on the recognition that in the processing of FM-stereo signals an adequate compression of the frequency deviation is achieved when only a portion of the audio-frequency stereo sum signal (0–15 KHz) and a portion of the double sideband amplitude-modulated stereo difference signal (23–53 KHz) of the demodulated stereo multiplex signal is adequately amplified and applied to the voltage-controlled oscillator. Consequently, the selection of the stereo multiplex signal in the loop filter need not be of a wideband nature, that is to say be effected over one consecutive frequency range, but may be effected over several, separate frequency ranges of the stereo multiplex signal by means of a like number of parallel filters. This results in the possibility of limiting the passband of the closed loop to a considerable extent, for example to 60 KHz, by using simple filters with a relatively low quality-factor (Q) effecting only a slight phase shift, while maintaining an effective compression of the frequency deviation.

When the invention is used, a phase shift of 90° or more is permissible in the IF-filter and the FM-detector at a much lower frequency (for example 70 KHz) than is possible with the prior art FM-receiver (160 to 180 KHz) without introducing instabilities. As a result thereof the bandwidth of the IF-filter can be chosen to be sufficiently narrow to realize an effective selectivity.

In a preferred embodiment of an FM-receiver the first low-pass filter is a first order filter having a bandwidth of the order of 5 KHz and the band-pass filter circuit is of the second order having a bandwidth of the order of 10 KHz.

In a further preferred embodiment of an FM-receiver in accordance with the invention that the bandpass filter circuit comprises, in succession, a first mixer stage for demodulating the stereo difference signal of a stereophonic FM-multiplex signal, which stereo difference signal is amplitude-modulated on a stereo carrier, a second low-pass filter for selecting the demodulated baseband stereo difference signal, and a second mixer stage for remodulating the baseband stereo difference signal. These two mixer stages are connected to an output of the stereo subcarrier regenerator. The second low-pass filter has or approaches a first order frequency characteristic.

When this technique in accordance with the invention is used, noise components which may cause instability in the closed loop because of their frequency position which generally is asymmetrical relative to the stereo carrier, are reduced by 6 dB, which improves the stability of the receiver. In addition, the availability of the demodulated audio-frequency stereo difference signal enables, in combination with the already available audio-frequency stereo sum signal, a simple decoding of the left and right stereophonic signals.

A still further preferred embodiment of an FM-receiver includes between the output of the stereo subcarrier regenerator and at least one of the two mixer stages a phase shifting circuit for producing a phase shift of the regenerated stereo sub-carrier. The absolute magnitude of this phase shift is at least substantially equal to the phase shift of the received stereo sub-carrier in the IF-filter and the FM-detector.

By using this technique it is possible to compensate for unwanted phase shifts introduced in the IF-filter and/or the FM-detector by an adequate phase adjustment in the phase shifting circuit. This reduces the harmonic distortion, when keeping the dimensioning of the circuits used unchanged or improves the IF-selectivity, at an unchanged distortion rate.

In a further preferred embodiment of such an FM-receiver the stereo sub-carrier regenerator comprises a phase-locked loop, a control input of which is coupled to the connection between the output of the FM-detector and an input of the loop filter.

This measure advantageously uses the stereo pilot signal between the FM-detector and the loop filter, the amplitude thereof being comparatively large, because of the compression of the frequency deviation being smaller for the stereo sum and stereo difference signal than for the stereo pilot signal.

The invention will now be further described by way of example with reference to the Figures shown in the accompanying drawing.

DESCRIPTION OF THE PREFERRED EMBODIMENTS

Figure 1:
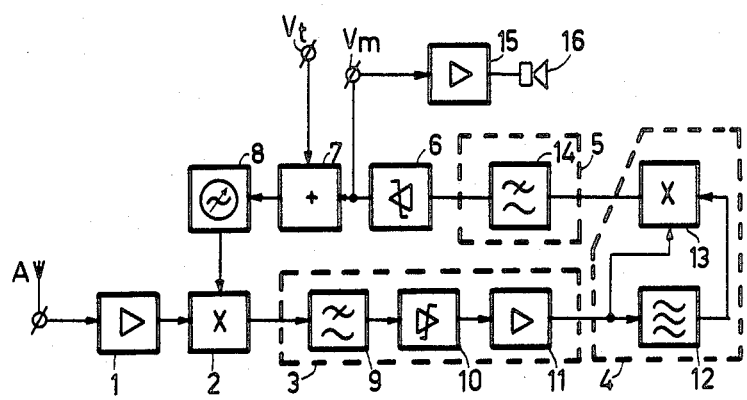
FIG. 1 shows a prior art FM-receiver for processing FM-mono signals.

FIG. 1 shows a prior art FM-receiver comprising, connected to an aerial A, an aerial-input, to which a frequency-locked loop 2-14 is coupled through an RF-input stage 1. The frequency-locked loop 2-14 comprises, successively connected, a voltage-controlled oscillator 8, a mixer circuit 2 connected to the RF-stage 1, an IF-portion 3 comprising an IF-low-pass filter 9, an amplifier/limiter 10 and an amplifier 11, an FM-quadrature detector 4 comprising a frequency-phase converter 12 and a multiplier circuit 13, a loop filter 5 which comprises a first low-pass filter 14, an amplifier/limiter 6, and an adder circuit 7 connected to a control input of the voltage-controlled oscillator 8. The adder circuit 7 is connected to a tuning voltage input $V_t$ to which a tuning voltage can be applied. An output of the amplifier/limiter 6 is connected to an audio output stage 15 and a loudspeaker 6 through a modulation signal output $V_m$.

The operation of this prior art FM-receiver is described in the above-mentioned Netherlands Patent Application No. 7906602, which has been laid open to public inspection. In this prior art receiver the following problems require a solution.

Figure 5:
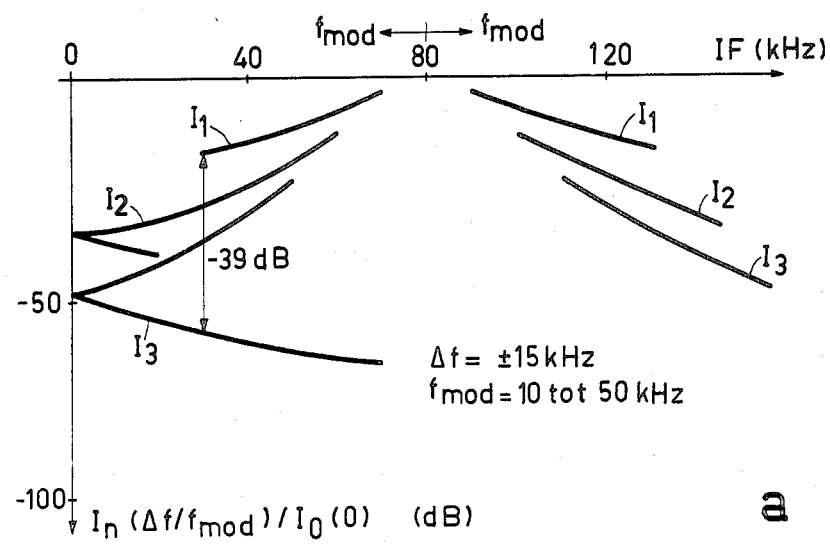
FIGS. 5a and b show some characteristics which represent the magnitude of three desired and some fold-over sideband components of the FM-IF-signal as a function of the modulation frequency for two values of the frequency deviation.
Figure 5:
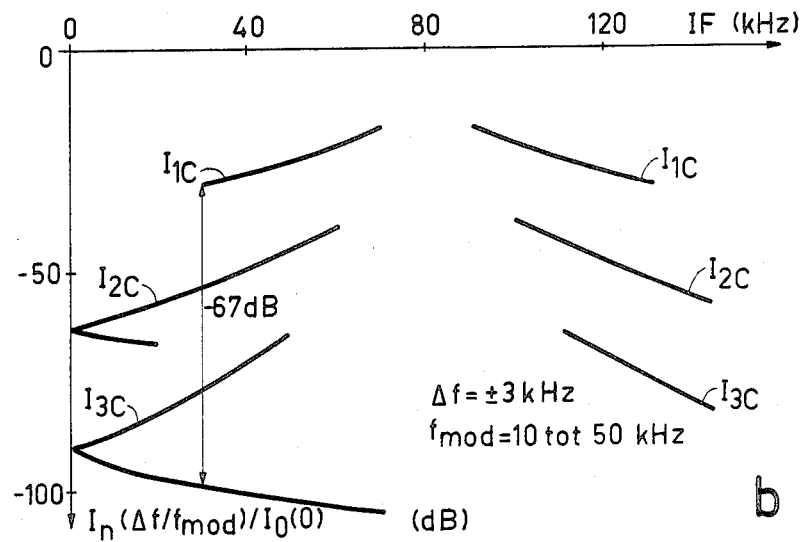

The use of a low intermediate frequency (for example 80 KHz) require a compression of the frequency deviation of the received signal. This is illustrated by the curves $I_1$-$I_3$ and $I_{1c}$-$I_{3c}$, in FIG. 5a and FIG. 5b, respectively. These curves show the amplitude of the standardized, $1^{st}$ to $3^{rd}$ order Bessel-function for an average intermediate frequency $\overline{IF}$ of 80 KHz as a function of modulation frequencies ($f_{mod}$) varying between 10 and 50 KHz at a frequency deviation $\Delta f$ of 15 KHz (weak deviation compression) and of 3 KHz (strong deviation compression), respectively. The fold-over of particularly the higher order Bessel-function at high modulation frequencies is considerably reduced by compression. An adequate frequency-deviation compression is achieved by applying the modulation signal from the output of the FM-quadrature detector 4 after amplification to the voltage-controlled oscillator 8.

Figure 3:
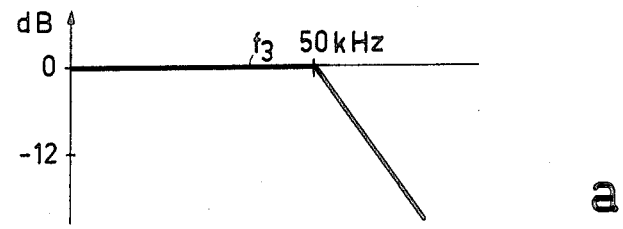
FIGS. 3a and b show transfer characteristics of the frequency-locked loop.
Figure 3:
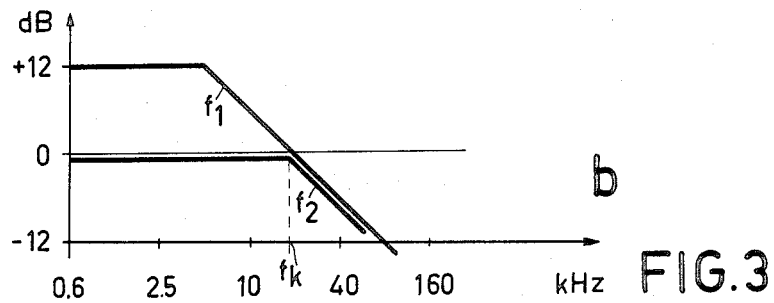

For a modulation signal having a bandwidth of the order of the bandwidth of an FM-mono-signal (15 KHz), this is realized when the transfer characteristic of the open and closed loop, respectively corresponds to the curves shown in FIG. 3b by means of curve $f_1$ and $f_2$, respectively. These curves are predominantly determined by the low-pass filter 14 of the loop filter 5, which is of the first order and has a band-width of approximately 5 KHz. As a result thereof, the frequency deviation compression is at its maximum (12 dB open loop gain of the modulation signal) for modulation frequencies up to 5 KHz, while the frequency deviation compression for modulation frequencies from 5-15 KHz decreases by a 6 dB/octave first order roll-off.

As a result thereof the 3 dB passband of the closed loop is 20 KHz and comprises the whole modulation signal. The maximum phase shift produced by the above-mentioned first low-pass filter within said passband for which the phase shift at the 20 KHz limit or edge frequency ($f_k$) is decisive, is approximately 90°. Consequently, the phase shift in the IF-filter and the FM-detector being permissible for stability at the 20 KHz 3 dB edge frequency ($f_k$) may not exceed 90°. This can be realized by means of a $4^{th}$ order IF-lowpass filter 9 whose transfer characteristic translated to the basic frequency domain is illustrated in FIG. 3a by curve $f_3$. The translated 3 dB edge frequency thereof is located at 50 KHz.

Figure 2:
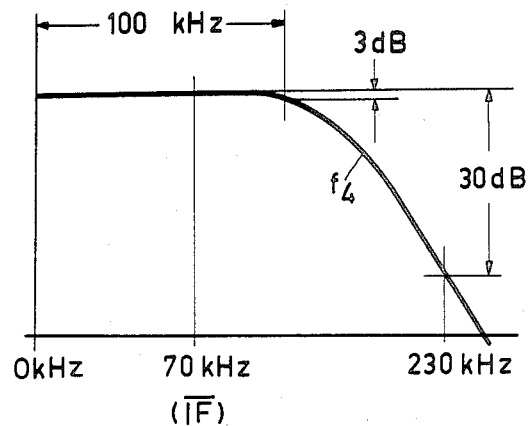
FIG. 2 shows the frequency characteristic of a fourth-order IF-low-pass filter in said FM-mono receiver.

The transfer characteristic of this IF-low-pass filter in the real frequency domain is illustrated in FIG. 2 by curve $f_4$. The real 3 dB edge frequency is approximately 100 KHz, while over a frequency spacing of approximately 160 KHz relative to the selected intermediate frequency $\overline{IF}=70$ KHz the attenuation increases to 30 dB. From this it can be seen that with such an IF-low-pass filter a satisfactory IF-selectivity is obtainable.

For further information about the translation of filter characteristics from one domain into another reference is made to the dissertation "Analysis of the FM-receiver with frequency feedback", by F. G. M. Bax, published on Oct. 23, 1970 at Eindhoven.

For an adequate frequency deviation compression of modulation signals having a bandwidth of the order of extent of a stereo multiplex signal (53 KHz) the open loop pass band must be, as mentioned already in the foregoing, 40 to 45 KHz and the open loop gain approximately 12 dB. This results, after adaptation of the filter parameter, in transfer characteristics as shown for the first low-pass filter in FIG. 4b by $f_5$ (open loop) and $f_6$ (closed loop) and for the IF-lowpass filter in FIG. 4a by curve $f_7$.

Because of the stability requirement, the translated 3 dB edge frequency now amounts to 200 KHz, which, in the real frequency domain, corresponds to 3 dB edge frequency of some hundreds of KHz. For reasons of selectivity such a wide-band IF-filter is impermissible.

Figure 6:
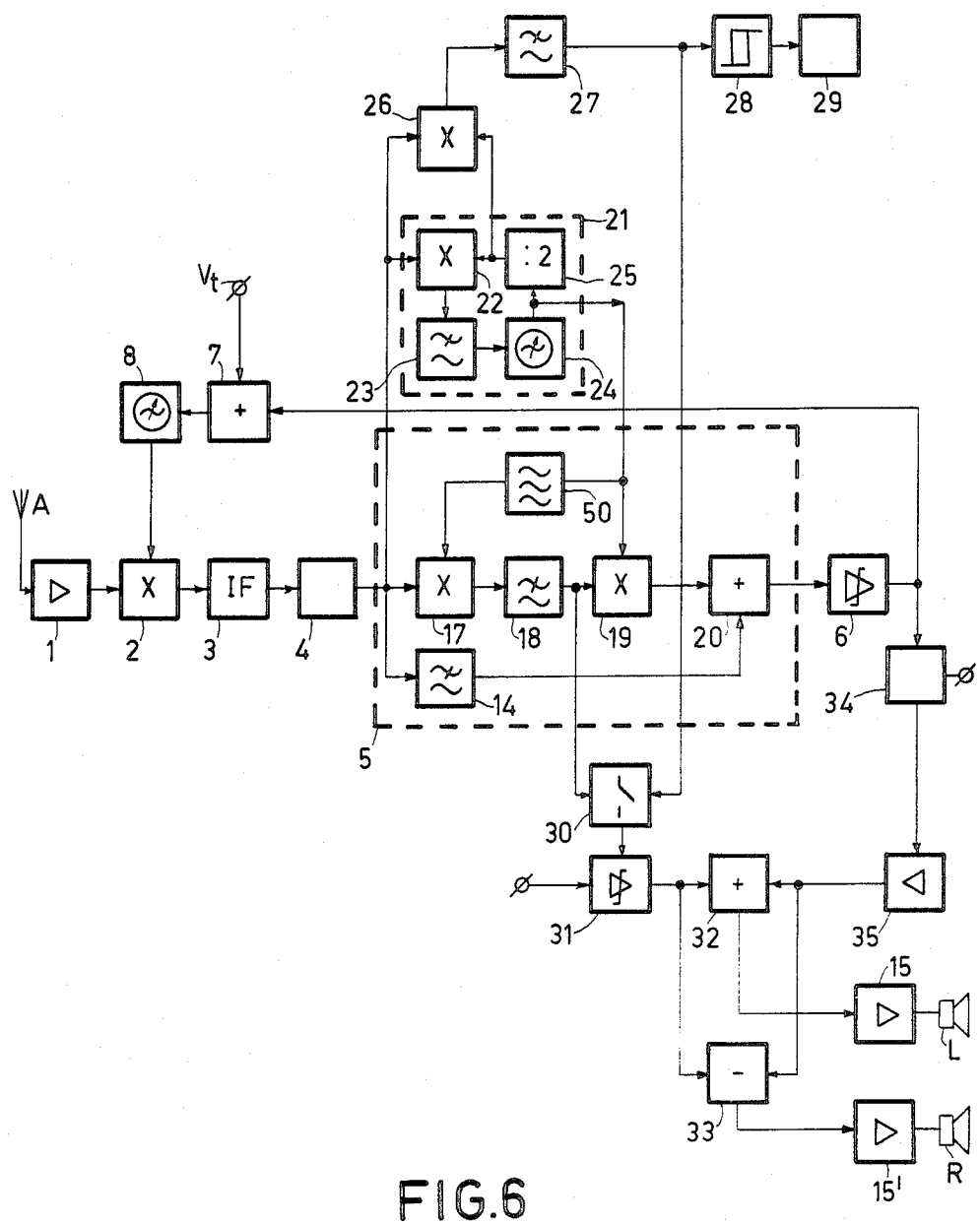
FIG. 6 shows a FM-receiver in accordance with the invention.

FIG. 6 shows an FM-receiver in accordance with the invention, in which the circuits corresponding to circuits of the prior art FM-receiver of FIG. 1 have been given the same reference numerals.

The FM-receiver in accordance with the invention differs from the prior art FM-receiver predominantly in the construction of the loop filter 5. In the embodiment shown the loop filter 5 comprises a band-pass filter 17–19 arranged in parallel with the first-order low-pass filter 14. The band-pass filter circuit 17–19 comprises, successively connected to the FM-quadrature detector 4, a first mixer stage 17, a second, first order low-pass filter 18 and a second mixer stage 19. A 38 KHz stereo sub-carrier is applied from a stereo sub-carrier regenerator 21 to the two mixer stages 17 and 19, a phase shifting circuit 50 being arranged between the stereo sub-carrier regenerator 21 and the first mixer stage.

As a result thereof, the stereo-difference signal of the stero multiplex signal at the output of the FM-quadrature detector 4, which stereo-difference signal is double-sideband amplitude-modulated on a suppressed 38 KHz stereo sub-carrier is demodulated in the first mixer stage 17 to the baseband, selected in the second, first order low-pass filter 18 and remodulated in the second mixer stage 19 on a suppressed 38 KHz stereo sub-carrier. As a result thereof, the bandpass filter circuit 17–19 operates as a second order band-pass filter having a central frequency of 38 KHz and a bandwidth and (first order) frequency characteristic determined by the low-pass filter 18. In a practical embodiment this bandwidth may optionally be chosen equal to the bandwidth of the first low-pass filter 14, that is to say equal to approximately 5 KHz. The stereo multiplex signal thus selected in the bandpass filter circuit 17–19 is adjusted to an amplitude level as indicated in FIG. 7b by curve $f_8$ and, after having been applied to the voltage-controlled oscillator 8, causes compression of the frequency deviation of the received FM-aerial signal. This compression is at a maximum in the frequency range up to approximately 5 KHz (12 dB open loop gain for both the stereo sum signal and the stereo difference signal) and decreases with a first order slope, that is to say 6 dB/octave for the frequency range from 5 to 15 KHz.

Figure 4:
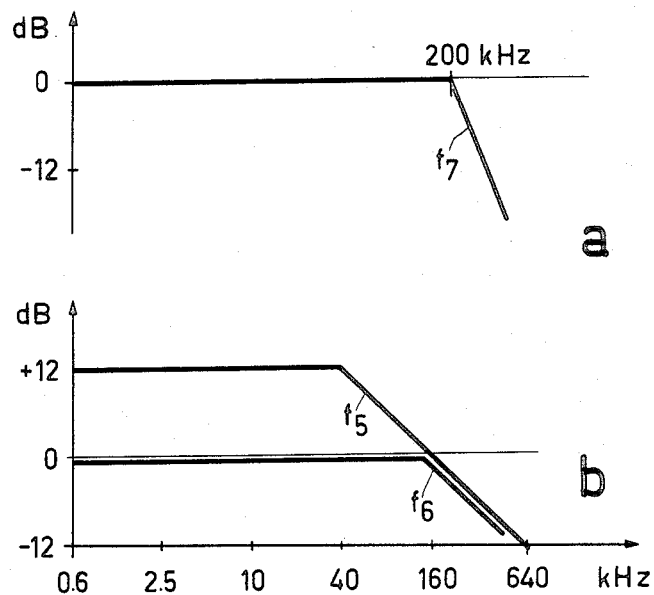
FIGS. 4a and b show transfer characteristics of the frequency-locked loop after an adaptation of some filter parameters of the prior art FM-receiver for processing the FM-stereo signals.
Figure 7:
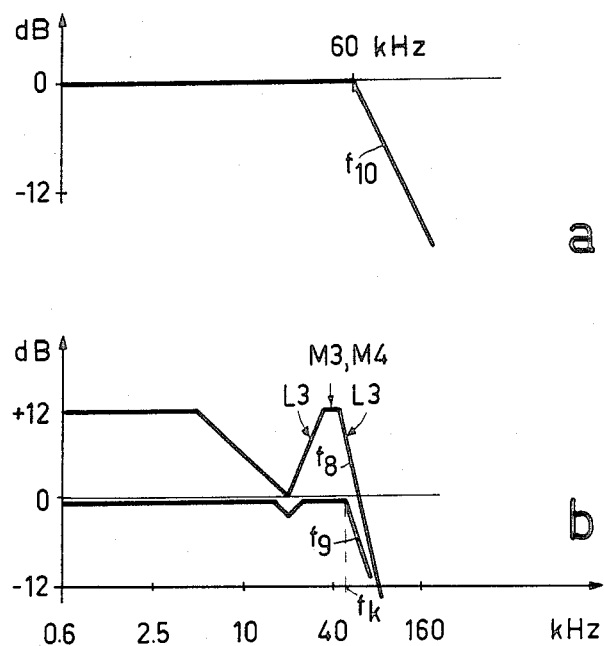
FIGS. 7a and b show transfer characteristics of the frequency-locked loop in the FM-receiver of FIG. 6.

The transfer characteristic of the closed loop is illustrated in FIG. 7 by curve $f_9$. As a result of the chosen filter parameters of the bandpass filter circuit 17–19 (central frequency 38 KHz; first order roll-off after 5 KHz), the pass-band of the closed loop is approximately 58 KHz. This passband comprises the whole stereo multiplex signal and is significantly smaller than the passband of the closed loop which is obtained after adaptation of the filter parameters of the prior art FM-receiver, as illustrated in FIG. 4 by the curve $f_6$. As a result of the function of the band-pass filter circuit 17–19 the phase shift at the 58 KHz 3 dB edge frequency $f_k$ is approximately 90°. Because of this, a phase shift ocurring in the IF-filter and the FM-detector is permissible, which, without introducing instabilities, reaches the value of 90° already at a much lower frequency (for example 60 KHz) than with the prior art FM-receiver. The transfer characteristic of a suitable $4^{th}$-order IF-low-pass filter, which characteristic is translated to the base-band domain, may therefore vary as illustrated in FIG. 7a by curve $f_{10}$. An effective IF-selectivity is obtained by means of such an IF-bandpass filter.

The realization of the bandpass filter circuit 17–19 with the aid of the first and second mixer stages 17 and 19 as shown also offers the possibility to compensate for the errors which are introduced at the demodulation and remodulation of the stereo difference signal annd which are produced by signal delays which may occur in the IF-filter and the FM-detector. Such errors may result in instabilities. To compensate for these errors in the embodiment as shown, the phase shift of the regenerated 38 KHz stereo sub-carrier in the phase shifting circuit 50 is chosen to be equal but opposite to the phase shift of the suppressed 38 KHz stereo sub-carrier of the IF-filter 3 and the FM-detector 4. As a result thereof the regenerated 38 KHz stereo sub-carrier, which is applied to the input of the second mixer stage 19, has the same phase as the received 38 KHz stereo sub-carrier at the input of the mixer circuit.

In an embodiment, not shown, wherein the regenerated 38 KHz stereo sub-carrier at the output of the stereo sub-carrier regenerator 21 has the same phase as the received 38 KHz stereo sub-carrier at the input of the mixer circuit, the phase shifting circuit 50 must be arranged between the output of the stereo sub-carrier regenerator 21 and the input of the first mixer stage 17 to obtain the same compensation as above. In that case the phase shift of the phase shifting circuit 50 must be equal to the phase shift of the 38 KHz stereo sub-carrier which occurs in the IF-filter and the FM-detector.

For a person skilled in the art such phase shifting circuits are simple to realize, for example by means of a delay network, and a further description is therefore not necessary. In practice it has been found that the phase shift of the 38 KHz stereo sub-carrier in the IF-portion and the FM-detector is approximately 90°, so that the phase shifting circuit 50 should preferably effect a −90° phase shift of the regenerated 38 KHz stereo sub-carrier in the embodiment shown and a 90° phase shift in the last-mentioned embodiment, not shown.

The regeneration of the (38 KHz) stereo sub-carrier for the demodulation and remodulation of the stereo difference signal in the band-pass filter circuit 17-19 is effected in the stereo sub-carrier regenerator 21, which comprises a phase locked-loop (PLL) 22-25. Therein the 19 KHz stereo pilot of the stereo multiplex signal at the output of the FM-quadrature detector 4 is multiplied in known manner in a mixer stage 22 by the output signal of an 38 KHz voltage-controlled oscillator 24, the frequency of which output signal is halved by a frequency divide-by-two divider 25. The output signal of the mixer stage 22 is applied as a phase control signal through a low-pass filter 23 to the voltage-controlled oscillator 24. As a result thereof, the 38 KHz oscillator signal is phase-coupled to the received 19 KHz stereo pilot and is applied as a mixing signal to the first and second mixer stages 17 and 19 of the band-pass filter circuit 17-19.

The 38 KHz oscillator signal whose frequency is halved in the frequency divide-by-two divider 25 is applied in the FM-receiver in accordance with the invention to a mixer stage 26 of a stereo pilot detector 26, 27. The received 19 KHz stereo pilot is also applied to the mixer stage 26. The output signal of the mixer stage 26 is filtered in a low-pass filter 27 and provides an indication about the presence of the stereo pilot in the received FM-signal. The stereo indication signal thus obtained is thereafter applied through a bistable multivibrator 28 to a stereo indicator 29 for an optical stereo indication.

The stereo indication signal is also applied as a mono/stereo switching signal to a control input of a switch 30, through which the demodulated baseband stereo difference signal is applied, in the case of stereo reception, from the output of the second low-pass filter 18 of the bandpass filter circuit 17-19 to a variable-gain amplifier 31. By means of selection in a filter and tuning circuit 34, the baseband stereo sum signal is filtered from the output of the loop rectifier 6 from the fedback stereo multiplex signal and applied to a matrix circuit 32, 33 through an amplifier 35. Also the baseband stereo difference signal of the variable gain amplifier 31 is applied to the matrix circuit 32, 33. In the matrix circuit 32, 33 the left and right stereophonic signal, respectively, decoded by addition and subtraction, respectively, the signal being reproduced through the respective amplifier 15, 15' in loudspeakers L and R.

The variable-gain amplifier 31 controls by means of a stereo control signal the amplitude of the baseband stereo difference signal applied to the matrix circuit 32, 33. As a result thereof the stereophonic effect of the reproduction is controllable, for example in dependence on the signal-to-noise ratio of the received FM-stereo signal. In the case of a stereo difference signal amplitude which increases from zero the stereophonic effect can increase from a mono reproduction (L−R=0) via stereo reproduction (L−R and L+R have equal amplitudes) to a so-called "enhanced" stereo reproduction, wherein the spacing between the left and right sound sources seems larger than in normal stereo reproduction.

It will be obvious that the invention is not limited to the embodiment shown. It is very well possible, while maintaining the advantage of the invention, to omit the phase shifting circuit 50, to replace the bandpass filter circuit 17-19 by a simple and optionally passive bandpass filter, and to change the bandwidth of the passband region of the open loop and/or the open loop gain. The invention is also not limited to the use of a low-pass filter as the IF-filter or an FM-quadrature detector as the FM-detector. Those skilled in the art will recognize yet other embodiments defined by the claims which follow.

What is claimed is:

1. An FM-receiver comprising a frequency lock loop including a voltage controlled oscillator, a mixer connected to receive an aerial input signal and said voltage controlled oscillator output signal, an IF filter connected to receive an IF signal from said mixer, an FM-detector connected to demodulate an IF signal from said IF filter, a loop filter connected to provide a control voltage from said FM-detector through a loop amplifier to said voltage controlled oscillator comprising:
   a first lowpass filter for selecting an audio-frequency stereo sum signal from a stereophonic FM multiplex signal; and
   a bandpass filter in parallel with the first lowpass filter for selecting a difference stereo signal amplitude modulated on a suppressed stereo sub-carrier from a stereophonic FM-multiplex signal;
   said first lowpass filter and bandpass filter having a phase shift within the frequency passband of the frequency lock loop of not more than 90°.

2. An FM-receiver as claimed in claim 1, wherein said first low-pass filter is a first order filter having a bandwidth of the order of 5 KHz, and the bandpass filter circuit is of the second order having a bandwidth of the order of 10 KHz.

3. An FM-receiver as claimed in claim 1 or 2, wherein the bandpass filter circuit comprises the serial connection of a first mixer stage for demodulating the stereo difference signal which stereo difference signal is amplitude-modulated on a stereo sub-carrier within a stereophonic FM-multiplex signal, a second low-pass filter for selecting the demodulated baseband stereo difference signal, and a second mixer stage for remodulating the baseband-stereo difference signal said mixer stages being connected to an output of a stereo sub-carrier regenerator and said second low-pass filter having or approaching a first order frequency characteristic.

4. An FM-receiver as claimed in claim 3, further comprising a phase shifting circuit between the output of the stereo sub-carrier regenerator and at least one of the two mixer stages, said phase shifting circuit producing a phase shift of the regenerated stereo sub-carrier, the absolute value of this phase shift being at least substantially equal to the phase shift of the received stereo sub-carrier in the IF-filter and the FM-detector.

5. An FM-receiver as claimed in claim 4, wherein the output of the stereo sub-carrier regenerator is connected to the second mixer stage and through the phase shifting circuit to the first mixer stage, the phase shift of the regenerated stereo sub-carrier being equal but opposite to the phase shift of the received stereo sub-carrier in the IF-filter and the FM-detector.

6. An FM-receiver as claimed claim 3 wherein an output of the second low-pass filter is connected to a first input of a matrix circuit and an output of the loop amplifier is connected to a second input of the matrix circuit for adding or subtracting, respectively therein the signals at said inputs of the matrix circuit.

7. An FM-receiver as claimed in claim 6, wherein a variable-gain amplifier is connected between the second low-pass filter and the first input of the matrix circuit.

8. An FM-receiver according to claim 3, wherein the stereo sub-carrier regenerator comprises a phase-locked loop a control input of which is coupled to the connection between an output of the FM-detector and an input of the loop filter.

* * * * *